US006882406B2

(12) United States Patent
Kurt et al.

(10) Patent No.: US 6,882,406 B2
(45) Date of Patent: Apr. 19, 2005

(54) EUV LITHOGRAPHIC PROJECTION APPARATUS COMPRISING AN OPTICAL ELEMENT WITH A SELF-ASSEMBLED MONOLAYER, OPTICAL ELEMENT WITH A SELF-ASSEMBLED MONOLAYER, METHOD OF APPLYING A SELF-ASSEMBLED MONOLAYER, DEVICE MANUFACTURING METHOD AND DEVICE MANUFACTURED THEREBY

(75) Inventors: Ralph Kurt, Eindhoven (NL); Jacob Wijdenes, Beek en Donk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/459,706

(22) Filed: Jun. 12, 2003

(65) Prior Publication Data

US 2004/0025733 A1 Feb. 12, 2004

(30) Foreign Application Priority Data

Jun. 14, 2002  (EP) ............................................ 02254176

(51) Int. Cl.$^7$ .......................... G03B 27/42; G03B 27/54
(52) U.S. Cl. ......................................... 355/67; 355/53
(58) Field of Search ................................. 438/464, 736; 430/325; 355/53, 66, 67

(56) References Cited

U.S. PATENT DOCUMENTS 5,885,753 A * 3/1999 Crooks et al. .............. 430/325

6,200,882 B1 * 3/2001 Drake et al. ................ 438/464
6,297,169 B1   10/2001 Mangat et al.

FOREIGN PATENT DOCUMENTS

| EP | 0 492 545 A3 | 7/1992 |
| EP | 0 492 545 A2 | 7/1992 |
| EP | 0 990 925 A1 | 4/2000 |
| FR | 2 752 834    | 3/1998 |
| JP | 11-20034     | 1/1999 |
| JP | 11-52102     | 2/1999 |

OTHER PUBLICATIONS

Abstract No. XP–002238584, "Method for repairing a magnesium fluoride antireflection coating on a lithographic stepper lens surface which has been damaged by exposure to hydrogen chloride gas comprises replacing the coating with an alumina–quartz bilayer coating," *Int. Business Machines Corp.*, vol. 431, No. 175 (2000).

Klebanoff et al., "Radiation–induced protective carbon coating for extreme ultraviolet optics," *J. Vac. Sci. Technol. B* 20(2):696–703 (2002), XP–002238582.

Hector et al., "Review of progress in extreme ultraviolet lithography masks," *J. Vac. Sci. Technol. B* 19(6):2001, XP–002238583.

* cited by examiner

*Primary Examiner*—Rodney Fuller
(74) *Attorney, Agent, or Firm*—Pillsbury Winthrop LLP

(57) ABSTRACT

An EUV lithographic apparatus contains an optical element, the surface of the optical element being modified to reduce the effects of reflectivity reduction by molecular contamination. The surface is modified such that it includes a self assembled monolayer.

15 Claims, 1 Drawing Sheet

EUV LITHOGRAPHIC PROJECTION APPARATUS COMPRISING AN OPTICAL ELEMENT WITH A SELF-ASSEMBLED MONOLAYER, OPTICAL ELEMENT WITH A SELF-ASSEMBLED MONOLAYER, METHOD OF APPLYING A SELF-ASSEMBLED MONOLAYER, DEVICE MANUFACTURING METHOD AND DEVICE MANUFACTURED THEREBY

RELATED APPLICATION

This application claims the benefit of priority to European Patent Application No. 02254176.7, filed Jun. 14, 2002, the entire contents of which are herein incorporated by reference.

BACKGROUND OF THE INVENTION

1. Field of the Invention

The present invention relates to an EUV lithographic projection apparatus including an optical element with a self-assembled monolayer, an optical element with a self-assembled monolayer, a method of applying a self-assembled monolayer, a device manufacturing method and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Because no material with suitable optical properties for making refractive optical elements for extreme ultraviolet (EUV) radiation is known, lithographic apparatus using such radiation must use reflective optics, made of grazing incidence mirrors or multilayer stacks. Multilayer stacks have reflectivities of a theoretical maximum of only about 70%. In view of this lower reflectivity, it is important to ensure that any drop in reflectivity due to molecular contamination is minimized. In spite of the high vacuum conditions which are imposed during use, molecular contaminants may be present within an EUV lithography apparatus. The reflectivity of the optical elements can therefore be reduced through oxidation of the top, e.g. silicon, layer of the mirror and also carbon growth on the surface of the mirror. Oxidation of the surface of the mirror under EUV radiation may be caused by the presence of water, while carbon growth, on the other hand, may occur due to the presence of hydrocarbons in the system.

SUMMARY OF THE INVENTION

This and other aspects are achieved according to the invention in a lithographic apparatus as specified in the opening paragraph including a radiation system constructed and arranged to provide a beam of radiation; a support constructed and arranged to support a patterning device, the patterning device constructed and arranged to pattern the beam according to a desired pattern; a substrate table constructed and arranged to hold a substrate; a projection system for projecting the patterned beam onto a target portion of the substrate, wherein at least one optical element in at least one of the radiation system and the projection system on which the projection beam is incident has, on its surface, a hydrophobic self-assembled monolayer.

The present invention also relates to an optical element which has a peak of reflectivity in the wavelength range 5 to 50 nm, wherein the optical element has, on its surface, a hydrophobic self-assembled monolayer. The wavelength range is typically below about 20 nm and preferably below about 15 nm. Examples of wavelengths of interest are 13.5 nm and in the region of 11 nm. In this context, reflectivity is typically greater than 40%, preferably greater than 50% and more preferably greater than 60%.

The optical element may be a beam modifying element such as a reflector, e.g. a multilayer near-normal incidence mirror, especially a Mo/Si multilayer mirror, or a grazing incidence mirror, included in at least one of the illumination system and the projection system; an integrator, such as a scattering plate; the mask, especially if a multilayer mask; or any other optical element involved in directing, focussing, shaping, controlling, etc. the projection beam. The optical element may also be a sensor such as an image sensor or a spot sensor.

The term "self-assembled monolayer" refers to a film composed of molecules that assemble themselves on a surface, by any mechanism, directly or via an intermediary and includes Langmuir-Blodgett films.

The self-assembled monolayer may be formed by the reaction of a modifying agent with the surface of the optical element. The modifying agent is any type of amphiphilic species, provided that the reaction between the modifying agent and the surface of the optical element results in the formation of a self assembled monolayer. Generally, the amphiphilic species will possess an alkyl chain and be functionalised to react with the surface. The nature of the functionality will depend upon the surface of optical element. Generally, the surface will be a silica-type surface and the preferred amphiphilic species will be a functionalised alkyl, preferably an alkylsilane. The surface of the optical element will thus be covered with an alkylsilane-based self assembled monolayer. However, depending upon the surface of the optical element, other amphiphilic species may be used, for example carboxylic acids can be used on an alumina-type surface.

The alkylsilane-based self-assembled monolayer of the present invention is generally formed by using, as the amphiphilic species, an alkylsilane of general formula:

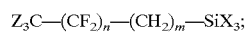

$$Z_3C-(CF_2)_n-(CH_2)_m-SiX_3;$$

wherein Z is H or F, n and m are independently any number from 0 to 21, preferably any number from 2 to 12, with the proviso that the sum of n and m is at least 5 and preferably at least 7, and X can be a halide such as Cl or Br, a $C_{1-4}$ alkoxy such as OMe or OEt, a hydroxy group or any other group which can be used to facilitate the binding of the silicon to the surface of the optical element. The three X groups in a single alkylsilane moiety may be the same or different. Preferably, the three X groups in a single alkylsilane moiety are the same.

The alkylsilanes for use in the present invention preferably have linear alkyl chains, however, the use of a branched chain alkylsilane is not excluded, provided that reaction of the branched chain alkylsilane with the surface of the optical element results in the formation of a self assembled monolayer.

The alkylsilanes preferably have an aliphatic alkyl chain and more preferably have a fluoro-alkyl or perfluoro-alkyl chain. In each case the alkyl chain has from 6 to 22 carbons, preferably from 6 to 18 carbons and more preferably from 8 to 12 carbons.

Specific examples of alkylsilanes which may be used to form the self-assembled monolayers of the present invention are $CH_3(CH_2)_9SiX_3$, $CH_3(CH_2)_{11}SiX_3$, $CH_3(CH_2)_{15}SiX_3$, $CH_3(CH_2)_{17}SiX_3$, $CH_3(CH_2)_{21}SiX_3$, $CF_3(CF_2)_5(CH_2)_2SiX_3$, $CF_3(CF_2)_7(CH_2)_2SiX_3$ or $CF_3(CF_2)_9(CH_2)_2SiX_3$, wherein X is as defined in the general formula.

The X group bound to the silicon may be any of the substituents mentioned in relation to the general formula, however, care must be taken when X is chlorine, since the by-products of the reaction may roughen the original surface and cause unwanted effects such as scattering.

The self-assembled monolayers of the present invention may be formed from a single alkylsilane or from a mixture of alkylsilanes. Preferably, the self-assembled monolayers are formed from a single alkylsilane.

The application of the monolayer to the surface of the optical element generally takes place after the surface has been cleaned. Methods of cleaning are well known in the art and generally include treatment using UV-ozone or plasma. This cleaning removes any contaminants which may affect the modification of the surface of the optical element. Preferably, the cleaning will leave a naturally adsorbed layer of water at the surface, such a layer assists in the production of a high quality monolayer.

Once cleaned, the surface of the optical element can be reacted with the modifying agent. This reaction is generally performed by reaction either in the gaseous phase or as an immersion reaction, however other methods of applying a monolayer, such as spin coating, may also be used. If performed in the gaseous phase, the cleaned element is placed in a vessel with some modifying agent, the vessel is evacuated to a pressure less than about 1 mbar and the system is allowed to stand. The reaction time is dependent upon the nature of the surface, the modifying agent and the amount of water which is present on the surface, however, it generally takes 6 to 24 hours. The reaction time can be reduced, for example by raising the temperature, but the formation of localized three dimensional structures should be avoided. If performed by way of an immersion reaction, the cleaned substrate is placed into a solution of the modifying agent. The solvent of the solution is dependent upon the nature of the modifying agent but, in the case of alkylsilanes, suitable solvents include alkanes, such as heptane or octane, aromatics, such as toluene, and alcohols, such as ethanol. Furthermore, when using alkylsilanes the presence of water in the solution should be avoided. The reaction time for an immersion reaction again depends on the nature of the surface and modifying agent but is generally from 10 minutes to 2 hours. When forming a self-assembled monolayer on the surface of an Mo/Si multilayer mirror, the temperature of reaction must be kept low since interlayer diffusion can commence above 100° C.

After the monolayer has been applied, the modified element can be stabilized. The time and temperature needed for the stabilization is dependent upon the nature of the modifying agent, however, aging in air for a few days or by baking at about 50° C. for a few hours is generally sufficient.

The surface coverage of the modification agent on the surface of the optical element has to be sufficient such that a self-assembled monolayer is formed. Typically, the surface coverage of the optical element by the self-assembled monolayer is around 70%, preferably the coverage is around 80%, more preferably the coverage is around 90%.

The monolayer should be thick enough to be stable under the irradiation conditions of the lithographic apparatus, however, it should not be too thick that it absorbs too much radiation. The thickness should be in the range of 0.5 to 10 nm, preferably from 1 to 5 nm and more preferably from 1 to 2.5 nm.

The two main pathways of reflection reduction of an optical element in a lithographic apparatus are ascribed to oxidation of the surface of the element due to the presence of water, and carbon build up on the surface of the element due to the presence of hydrocarbons in the system. The present invention acts to decrease the effects of reflection reduction by both of these pathways.

Firstly, the formation of a self-assembled monolayer on the surface of the optical element acts to change the surface of the optical element from being hydrophilic in character to being hydrophobic in character. Thus, the presence of water at the surface is reduced and the effects of oxidation consequently lessened. Secondly, the use of an aliphatic or fluoroalkyl modifying agent results in the formation of a surface which is non-polar and of low energy. Consequently, a large variety of hydrocarbon compounds are unable to stick to the modified surface in a way that would be possible if the surface was unmodified. Furthermore, the layer itself does not act to significantly reduce the reflectivity of the optical element and has also been shown to be stable under the conditions of use.

The self-assembled monolayers of the present invention have been found to be stable after 50 hour exposure to an e-gun, i.e. there was found to be no loss in the reflectivity of a multilayer mirror. After 100 hr under such exposure there was found to be a loss of reflectivity, this loss being in the region of 9%. However, such conditions are much harsher than those experienced during the use of a lithographic projection apparatus.

It has been found that the self-assembled monolayers of the present invention can be applied or reapplied in situ to the surface of an optical element of a lithographic projection apparatus. Such a procedure can be performed by releasing a modifying agent into the vacuum chamber which contains the optical elements. The procedure can thus be performed without disassembly of the apparatus, however, is not performed during exposure to EUV radiation. Such a procedure represents a significant advantage since it avoids the necessity of removing the mirrors from the system, thus the procedure can be performed both quickly and without the risk of exposing the mirrors to contamination.

According to a further aspect of the invention there is provided a device manufacturing method including providing a substrate that is at least partially covered by a layer of radiation-sensitive material; projecting a patterned beam of radiation onto a target portion of the layer of radiation-sensitive material, wherein at least one optical element on which the projection beam of radiation is incident has, on its surface, a self-assembled monolayer.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
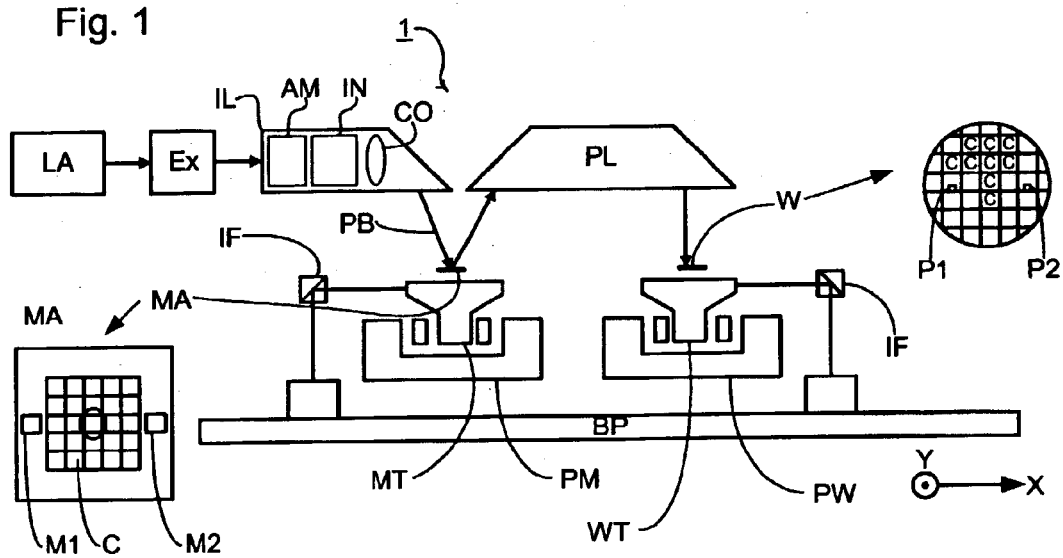
FIG. 1 depicts a lithographic projection apparatus according to an embodiment of the invention.

FIG. 1 schematically depicts a lithographic projection apparatus 1 according to an embodiment of the invention. The apparatus 1 includes a base plate BP; a radiation system Ex, IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illu directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
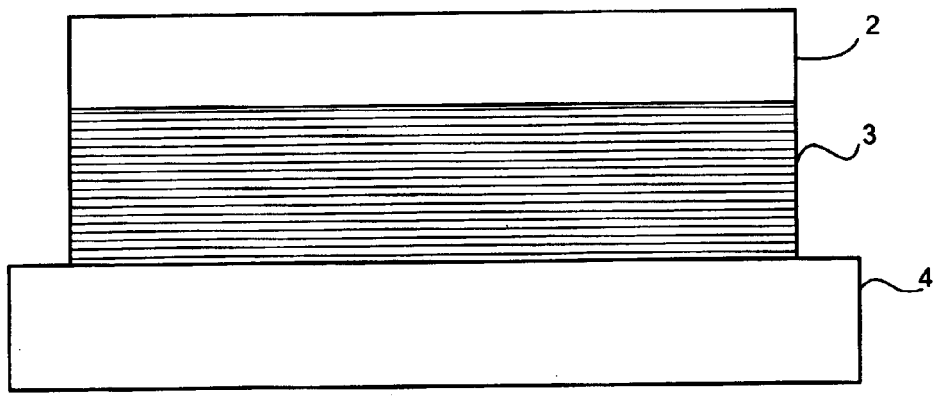
FIG. 2 depicts an optical element including a self-assembled monolayer according to the present invention.

FIG. 2 schematically depicts an optical element, in this case a reflector, in a projection system according to the present invention. The optical element includes a self-assembled monolayer 2 (e.g. an alkylsilane self-assembled monolayer); an Mo/Si multilayer mirror stack 3; and a substrate 4, which supports the multilayer.

The surface of an Mo/Si multilayer mirror was prepared by cleaning using UV/ozone or an oxygen plasma reactor. In such a process a thin oxide film usually remains at the surface and the presence of such a hydrophilic surface results in a thin layer of water molecules being retained at the surface. Such water molecules are desirable for the production of a high-quality SAM film.

The mirror was placed in a pre-vacuum chamber ($\sim 10^{-1}$ mbar) together with the alkylsilane, in this case perfluorodecyltriethoxysilane. Generally, approximately 200 μl of alkylsilane is sufficient to coat 0.1 m² of the mirror surface. The reactants were then left for approximately 12 hours such that a self-assembled monolayer formed on the surface of the mirror.

The monolayer was stabilized by either aging in air for a few days or by baking at 50° C. for a few hours. The modified surface was found to have a film thickness of approximately 1.2 nm. Measurement of the water contact angle of the modified surface gave a result of $\sim 110°$, corresponding to a surface energy of about 10–20 mJ/m².

Comparative Example 1 is a standard Mo/Si multilayer mirror. The surface of this mirror exhibits a water contact angle of 5–15°. The reflectivity (R) of such a mirror is initially 68%, however, this reflectivity decreases in a linear fashion during the conditions of use in an EUV lithography apparatus such that the reflectivity loss ΔR/R is approximately 8% in a twenty hour period.

Example 1 was first exposed for 24 hours in $10^{-6}$ mbar $H_2O$ and then for 24 hours in $10^{-8}$ mbar diethylphthalate. After these treatments, the water contact angle of the surface of the mirror was measured and there was found to be no significant change when compared to that measured previously. The self-assembled monolayer was also found to be stable at temperatures up to 400° C. in both air and $N_2$.

The reflectivity of Example 1 was found to be 67%. The reflectivity was also measured after exposure for 50 hours to an e-gun, replicating the effects of exposure to EUV radiation, and the reflectivity after exposure was found to be essentially the same as that prior to exposure. However, after 100 hours there was a reflectivity loss ΔR/R of approximately 9%.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a beam of EUV radiation;
   a support constructed and arranged to support a patterning device, the patterning device constructed and arranged to pattern the beam according to a desired pattern;
   a substrate table constructed and arranged to hold a substrate;
   a projection system constructed and arranged to project the patterned beam onto a target portion of the substrate, wherein at least one optical element in at least one of the radiation system and the projection system on which the beam is incident has, on its surface, a hydrophobic self-assembled monolayer.

2. An apparatus according to claim 1, wherein the self-assembled monolayer is an alkylsilane-based self-assembled monolayer.

3. An apparatus according to claim 2, wherein the alkylsilane has a $C_{6-22}$ alkyl or perfluorinated alkyl chain.

4. An apparatus according to claim 1, wherein the self-assembled monolayer is formed from $Z_3C$—$(CF_2)_n$—$(CH_2)_m$—$SiX_3$, wherein Z is H or F, n and m are independently any number from 0 to 21 wherein n+m is at least 5, and X is halide, alkoxy or hydroxy.

5. An apparatus according to claim 1, wherein the self-assembled monolayer is formed from a substance comprising $CH_3(CH_2)_9SiX_3$, $CH_3(CH_2)_{11}SiX_3$, $CH_3(CH_2)_{15}SiX_3$, $CH_3(CH_2)_{17}SiX_3$, $CH_3(CH_2)_{21}SiX_3$, $CF_3(CF_2)_5(CH_2)_2SiX_3$, $CF_3(CF_2)_7(CH_2)_2SiX_3$ or $CF_3(CF_2)_9(CH_2)_2SiX_3$, wherein X is halide, alkoxy or hydroxy.

6. An apparatus according to claim 1, wherein the thickness of the monolayer is from 0.5 to 10 nm.

7. An apparatus according to claim 1, wherein the thickness of the monolayer is from 1 to 5 nm.

8. An apparatus according to claim 1, wherein the thickness of the monolayer is from 1 to 2.5 nm.

9. An apparatus according to claim 1, wherein the at least one optical element is a multilayer mirror.

10. An apparatus according to claim 1, wherein the support comprises a mask table constructed and arranged to hold a mask.

11. An apparatus according to claim 1, wherein the radiation system comprises a radiation source.

12. An optical element which has a peak of reflectivity in the wavelength range of 5 to 50 nm, wherein the optical element has, on its surface, a hydrophobic self-assembled monolayer.

13. A device manufacturing method, comprising:
    providing a substrate that is at least partially covered by a layer of radiation-sensitive material; and
    projecting a patterned beam of radiation onto a target portion of the layer of radiation-sensitive material, wherein at least one optical element on which the patterned beam of radiation is incident has, on its surface, a hydrophobic self-assembled monolayer.

14. A device manufactured by the method according to claim 13.

15. A method of applying a self-assembled monolayer to the surface of an optical element in a lithographic projection apparatus, the method comprising
    releasing a modifying agent into a vacuum chamber of the lithographic projection apparatus, the optical element being within the vacuum chamber.

* * * * *